(12) United States Patent
Singh (10) Patent No.: US 11,095,260 B2
(45) Date of Patent: Aug. 17, 2021

(54) AMPLIFIER WITH LOW DRIFT BIASING

(71) Applicant: TEXAS INSTRUMENTS INCORPORATED, Dallas, TX (US)

(72) Inventor: Ravpreet Singh, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 138 days.

(21) Appl. No.: 16/535,194

(22) Filed: Aug. 8, 2019

(65) Prior Publication Data

US 2020/0204125 A1 Jun. 25, 2020

(30) Foreign Application Priority Data

Dec. 24, 2018 (IN) .............................. 201841048924

(51) Int. Cl.
*H03F 1/22* (2006.01)
*H03F 3/45* (2006.01)
*H03F 1/02* (2006.01)

(52) U.S. Cl.
CPC ....... *H03F 3/45085* (2013.01); *H03F 1/0211* (2013.01); *H03F 2200/375* (2013.01); *H03F 2203/45041* (2013.01); *H03F 2203/45322* (2013.01); *H03F 2203/45326* (2013.01); *H03F 2203/45354* (2013.01)

(58) Field of Classification Search
CPC ... H03F 1/22; H03F 1/223; H03F 3/45; H03F 2200/468
USPC .......................................... 330/256, 289, 311
See application file for complete search history.

(56) References Cited

U.S. PATENT DOCUMENTS 5,982,201 A * 11/1999 Brokaw .................. H03F 3/345
323/312
2020/0083847 A1 * 3/2020 Seetharam ........... H03G 1/0029

* cited by examiner

*Primary Examiner* — Steven J Mottola
(74) *Attorney, Agent, or Firm* — John R. Pessetto; Charles A. Brill; Frank D. Cimino (57) ABSTRACT

An amplifier includes an input transistor, an input terminal, a first current source, a cascode transistor, and a second current source. The input transistor is coupled to the input terminal. The first current source is coupled to the input transistor and is configured to provide a bias current to the input transistor that is proportional to absolute temperature. The cascode transistor is coupled to the input transistor. The second current source is coupled to the cascode transistor and is configured to provide a bias current to the cascode transistor that is complementary to absolute temperature.

16 Claims, 5 Drawing Sheets

AMPLIFIER WITH LOW DRIFT BIASING

CROSS-REFERENCE TO RELATED APPLICATIONS

The present application claims priority to India Provisional Patent Application No. 201841048924, filed Dec. 24, 2018, entitled "Low Drift Biasing of BJT Amplifiers," which is hereby incorporated herein by reference in its entirety.

BACKGROUND

Of the many available electronic devices, operational amplifiers (op-amps) are some of the most widely used. Op-amps are efficient and versatile devices that can be used in a variety of applications, such as signal conditioning, analog instrumentation, analog computation, etc.

An operational amplifier may include multiple stages, where each stage is designed to perform different functions. For example, an earlier stage (in the signal path) may be designed to provide voltage/current amplification, while a later stage may be designed to provide power amplification while maintaining a high efficiency.

SUMMARY

Operational amplifiers with low drift biasing in the input stage are disclosed herein. In one example, an amplifier includes an input transistor, an input terminal, a first current source, a cascode transistor, and a second current source. The input transistor is coupled to the input terminal. The first current source is coupled to the input transistor and is configured to provide a bias current to the input transistor that is proportional to absolute temperature. The cascode transistor is coupled to the input transistor. The second current source is coupled to the cascode transistor and is configured to provide a bias current to the cascode transistor that is complementary to absolute temperature.

In another example, an amplifier includes a first input terminal, a second input terminal, a first input transistor, a second input transistor, a first current source, a first cascode transistor, a second cascode transistor, and a second current source. The first input transistor includes a first terminal coupled to the first input terminal. The second input transistor includes a first terminal coupled to the second input terminal, and a second terminal coupled to a second terminal of the first input transistor. The first current is source coupled to the second terminal of the second input transistor and is configured to provide a bias current to the first input transistor and the second input transistor that is proportional to absolute temperature. The first cascode transistor includes a first terminal coupled to a third terminal of the first input transistor. The second cascode transistor includes a first terminal coupled to a third terminal of the second input transistor. The second current source is coupled to the second cascode transistor and is configured to provide a bias current to the second cascode transistor that is complementary to absolute temperature.

In a further example, an amplifier input stage includes a first input transistor, a second input transistor, a PTAT current source, a first cascode transistor, a second cascode transistor, and one or more CTAT current sources. The first input transistor and the second input transistor connected as a differential pair. The PTAT current source is coupled to the first input transistor and the second input transistor and is configured to provide a bias current to the first input transistor and the second input transistor that is proportional to absolute temperature. The first cascode transistor is coupled to the first input transistor. The second cascode transistor is coupled to the second input transistor. The one or more CTAT current sources are coupled to the first cascode transistor and the second cascode transistor and are configured to provide bias currents to the first cascode transistor and the second cascode transistor that are complementary to absolute temperature.

In a yet further example, a method includes supplying a first bias current that is proportional to absolute temperature to a cascode transistor of an amplifier input stage. The power supply current of the amplifier is trimmed while the supplying the first bias current. The first bias current is disabled, and a second bias current is supplied to the cascode transistor. The second bias current is complementary to absolute temperature.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

In theory, amplifiers that include bipolar input transistors have an offset drift that is proportional to absolute temperature PTAT). PTAT offset drift is advantageous because trimming of offset voltage a room temperature also trims the offset drift. However, in practice, the offset drift deviates from PTAT.

The amplifiers disclosed herein reduce the deviation of offset drift from PTAT. The input stage of the amplifiers includes a differential input pair and a folded cascode coupled to each transistor of the differential pair. A PTAT bias current is applied to the transistors of the differential pair. A bias current that is complementary to absolute temperature (CTAT) is applied to the folded cascodes. The CTAT bias current makes the base current of the folded cascode transistors PTAT, and the beta mismatch thereof PTAT. Offset drift of the amplifiers is greatly reduced relative to amplifiers that apply PTAT currents to bias both the differential pair and the folded cascodes.

Figure 1:
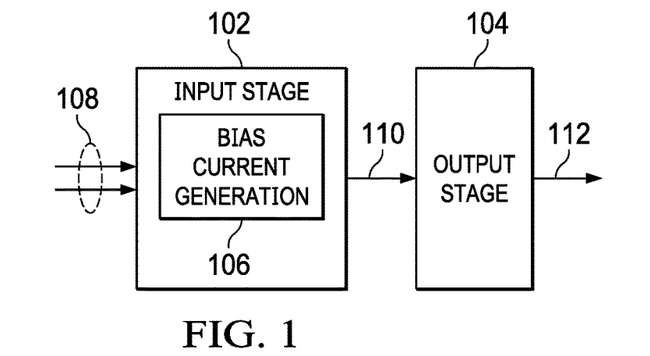
FIG. 1 shows a schematic diagram for an example amplifier that includes low drift biasing in accordance with the present disclosure.

FIG. 1 shows a schematic diagram for an example amplifier 100 that includes low drift biasing in accordance with the present disclosure. The amplifier 100 includes an input stage 102 and an output stage 104. The input stage 102 receives a differential input signal 108 and produces an output signal 110. The output stage 104 receives the output signal 110 generated by the input stage 102, and further amplifies the output signal 110 to produce amplifier output signal 112. The output stage 104 includes class-AB amplifier circuitry in some implementations.

The input stage 102 includes bipolar input transistors, bipolar cascode transistors, and bias current generation circuitry 106 that provides bias currents for operation of the bipolar input transistors and the bipolar cascode transistors. The bias current generation circuitry 106 provides a bias current to the bipolar input transistors that is PTAT and provides a bias current to the bipolar cascode transistors that is CTAT. The CTAT bias current reduces the offset drift of the amplifier 100.

Figure 2:
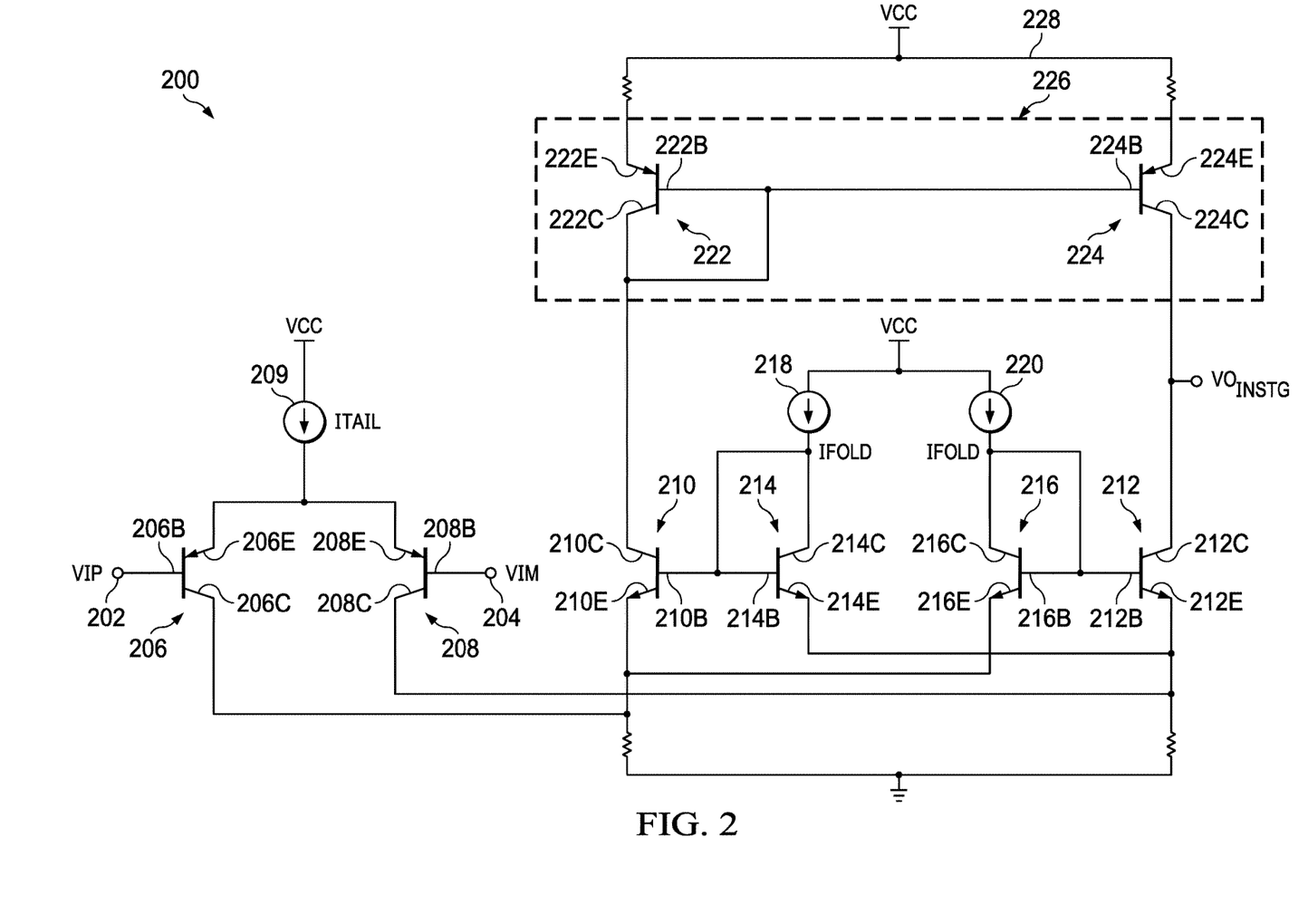
FIGS. 2 and 3 show schematic diagrams for a portion of an example amplifier input stage that includes CTAT bias current in accordance with the present disclosure.

FIG. 2 shows a schematic diagram for an example amplifier input stage 200 that includes CTAT bias current in accordance with the present disclosure. The amplifier input stage 200 is an implementation of the input stage 102. The amplifier input stage 200 includes an input terminal 202, and input terminal 204, input transistor 206, an input transistor 208, a current source 209, a cascode transistor 210, a cascode transistor 212, a diode-connected transistor 214, a diode-connected transistor 216, and a current source 218, a current source 220, and a current mirror circuit 226.

The input transistor 206 and the input transistor 208 form a differential pair. The current source 209 is coupled to the emitter terminal 206E of the input transistor 206 and the emitter terminal 208E of the input transistor 208. The current source 209 provides a PTAT bias current to the input transistor 206 and the input transistor 208. The base terminal 206B of the input transistor 206 is coupled to the input terminal 202. The base terminal 208B of the input transistor 208 is coupled to the input terminal 204. The input transistor 206 and the input transistor 208 are bipolar PNP transistors in some implementations of the amplifier input stage 200.

The input transistor 206 and the input transistor 208 are coupled to the cascode transistor 210 and the cascode transistor 212. The collector terminal 206C of the input transistor 206 is coupled to the emitter terminal 210E of the cascode transistor 210, and the collector terminal 208C of the input transistor 208 is coupled to the emitter terminal 212E of the cascode transistor 212. The diode-connected transistor 214 is coupled to the cascode transistor 210. The base terminal 210B of the cascode transistor 210 is coupled to the base terminal 214B and the collector terminal 214C of the diode-connected transistor 214. The current source 218 is coupled to the base terminal 210B of the cascode transistor 210, and the collector terminal 214C and the base terminal 214B of the diode-connected transistor 214. The current source 218 provides a CTAT bias current to the cascode transistor 210.

The diode-connected transistor 216 is coupled to the cascode transistor 212. The base terminal 212B of the cascode transistor 212 is coupled to the base terminal 216B and the collector terminal 216C of the diode-connected transistor 216. The current source 220 is coupled to the base terminal 212B of the cascode transistor 212, and the collector terminal 216C and base terminal 216B of the diode-connected transistor 216. The current source 220 provides a CTAT bias current to the cascode transistor 212. The cascode transistor 210, the cascode transistor 212, the diode-connected transistor 214, and the diode-connected transistor 216 are bipolar NPN transistors in some implementations of the amplifier input stage 200.

The collector terminal 210C of the cascode transistor 210 and the collector terminal 212C of the cascode transistor 212 are coupled to the current mirror circuit 226. The current mirror circuit 226 includes transistor 222 and transistor 224. The transistor 222 and the transistor 224 are bipolar PNP transistors in some implementations of the amplifier input stage 200. The transistor 222 is connected as a diode with the base terminal 222B coupled to the collector terminal 222C and the collector terminal 210C of the cascode transistor 210. The emitter terminal 222E of the transistor 222 is coupled to the power supply rail 228.

The base terminal 224B of the transistor 224 is coupled to the base terminal 222B of the transistor 222. The collector terminal 224C of the transistor 224 is coupled to the collector terminal 212C of the cascode transistor 212. Output of the amplifier input stage 200 is taken at the collector terminal 212C of the cascode transistor 212. The emitter terminal 224E of the transistor 224 is coupled to the power supply rail 228.

Figure 3:
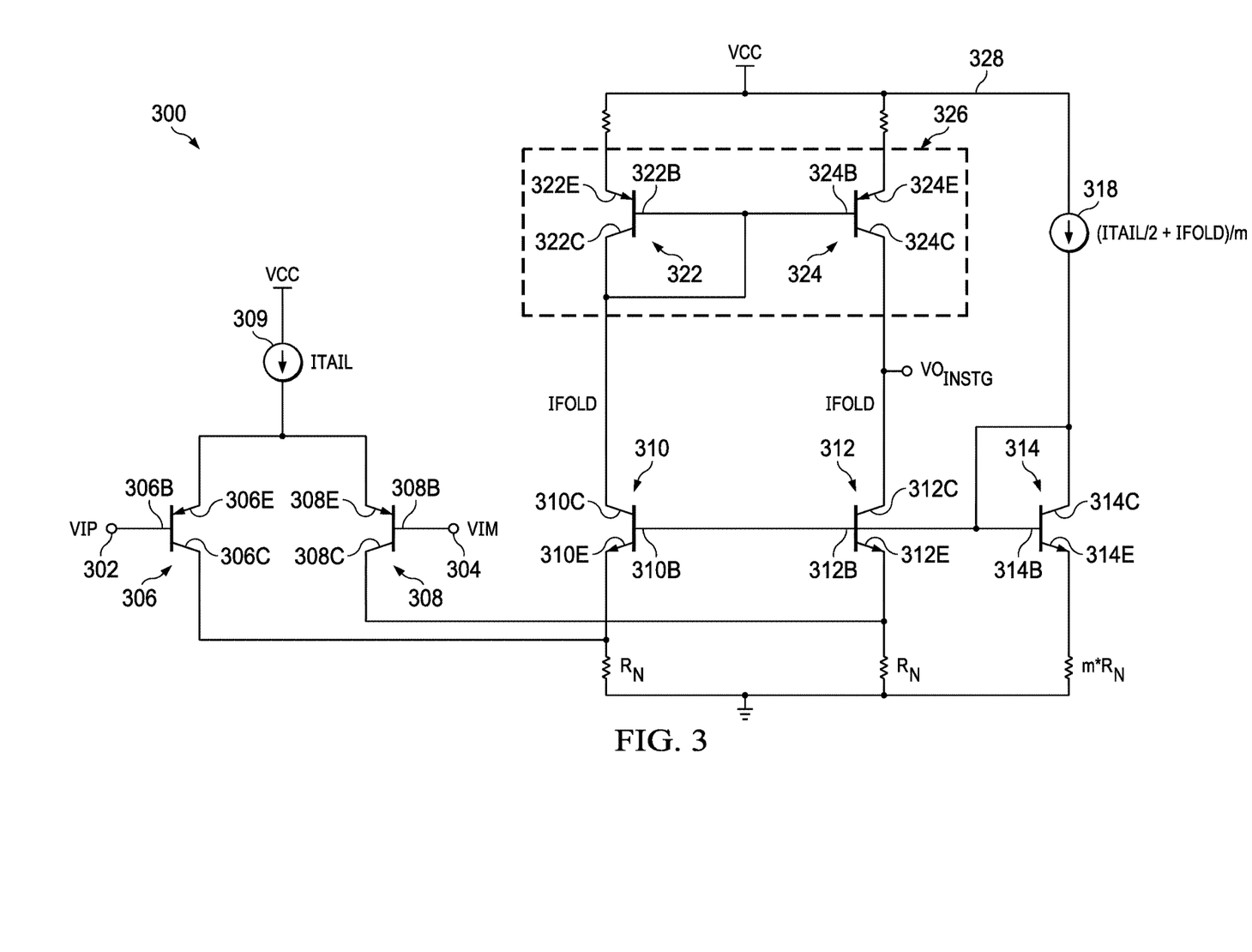

FIG. 3 shows a schematic diagram for an example amplifier input stage 300 that includes CTAT bias current in accordance with the present disclosure. The amplifier input stage 300 is an implementation of the input stage 102. The amplifier input stage 300 includes an input terminal 302, and input terminal 304, input transistor 306, an input transistor 308, a current source 309, a cascode transistor 310, a cascode transistor 312, a diode-connected transistor 314, a current source 318, and a current mirror circuit 326.

The input transistor 306 and the input transistor 308 form a differential pair. The current source 309 is coupled to the emitter terminal 306E of the input transistor 306 and the emitter terminal 308E of the input transistor 308. The current source 309 provides a PTAT bias current to the input transistor 306 and the input transistor 308. The base terminal 306B of the input transistor 306 is coupled to the input terminal 302. The base terminal 308B of the input transistor 308 is coupled to the input terminal 304. The input transistor 306 and the input transistor 308 are bipolar PNP transistors in some implementations of the amplifier input stage 300.

The input transistor 306 and the input transistor 308 are coupled to the cascode transistor 310 and the cascode transistor 312. The collector terminal 306C of the input transistor 306 is coupled to the emitter terminal 310E of the cascode transistor 310, and the collector terminal 308C of the input transistor 308 is coupled to the emitter terminal 312E of the cascode transistor 312. The diode-connected transistor 314 is coupled to the cascode transistor 310 and the cascode transistor 312. The diode-connected transistor 314 is connected with the collector terminal 314C of the diode-connected transistor 314 coupled to the base terminal 314B of the diode-connected transistor 314, the base terminal 310B of the cascode transistor 310, and the base terminal 312B of the cascode transistor 312. The current source 318 is coupled to the collector terminal 314C of the diode-connected transistor 314. The current source 318 provides a CTAT current to the diode-connected transistor 314, and the CTAT current is reflected at the collector terminal 310C of the cascode transistor 310 and the collector terminal 312C of the cascode transistor 312. The cascode transistor 310, the cascode transistor 312, and the diode-connected transistor 314 are bipolar NPN transistors in some implementations of the amplifier input stage 300.

The collector terminal 310C of the cascode transistor 310 and the collector terminal 312C of the cascode transistor 312 are coupled to the current mirror circuit 326. The current mirror circuit 326 includes transistor 322 and transistor 324. The transistor 322 and the transistor 324 are bipolar PNP transistors in some implementations of the amplifier input stage 300. The transistor 322 is connected as a diode with the base terminal 322B coupled to the collector terminal 322C and the collector terminal 310C of the cascode transistor 310. The emitter terminal 322E of the transistor 322 is coupled to the power supply rail 328.

The base terminal 324B of the transistor 324 is coupled to the base terminal 322B of the transistor 322. The collector terminal 322S of the transistor 222 is coupled to the collector terminal 312C of the cascode transistor 312. Output of the amplifier input stage 300 is taken at the 312C of the cascode transistor 312. The emitter terminal 324E of the transistor 324 is coupled to the power supply rail 328.

Figure 4:
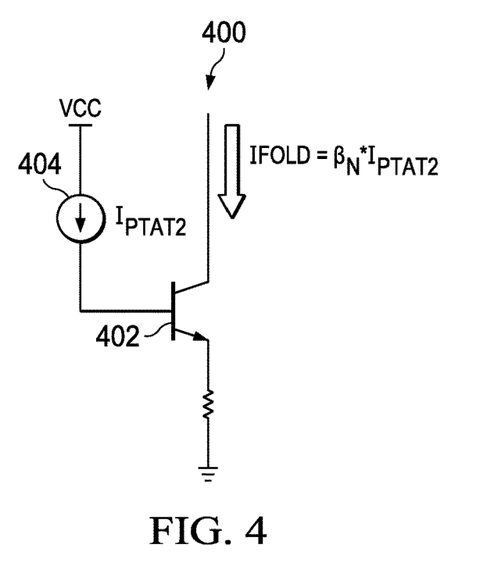
FIG. 4 shows a schematic diagram for a CTAT bias current generator in accordance with the present disclosure.

FIG. 4 shows a schematic diagram for a CTAT bias current generator 400 in accordance with the present disclosure. The CTAT bias current generator 400 is an implementation of the current source 218, the current source 220, or the current source 318. The CTAT bias current generator 400 includes a transistor 402 and a current source 404. The current source 404 is coupled to the base terminal of the transistor 402. The current source 404 provides a current that is proportional to absolute temperature. The PTAT current at the base of the transistor 402 produces a CTAT current at the collector of the transistor 402. The PTAT current provided by the current source 404 is trimmed to produce the desired CTAT current at the collector of the transistor 402. The CTAT current makes the base current of the cascode transistors PTAT, and as a result, the mismatch in beta of the cascode transistors also becomes PTAT.

Figure 5:
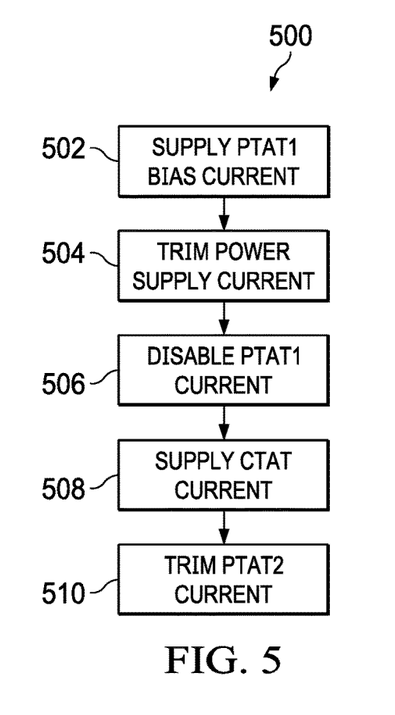
FIG. 5 shows a flow diagram for a method for trimming an amplifier circuit in accordance with the present disclosure.
Figure 6:
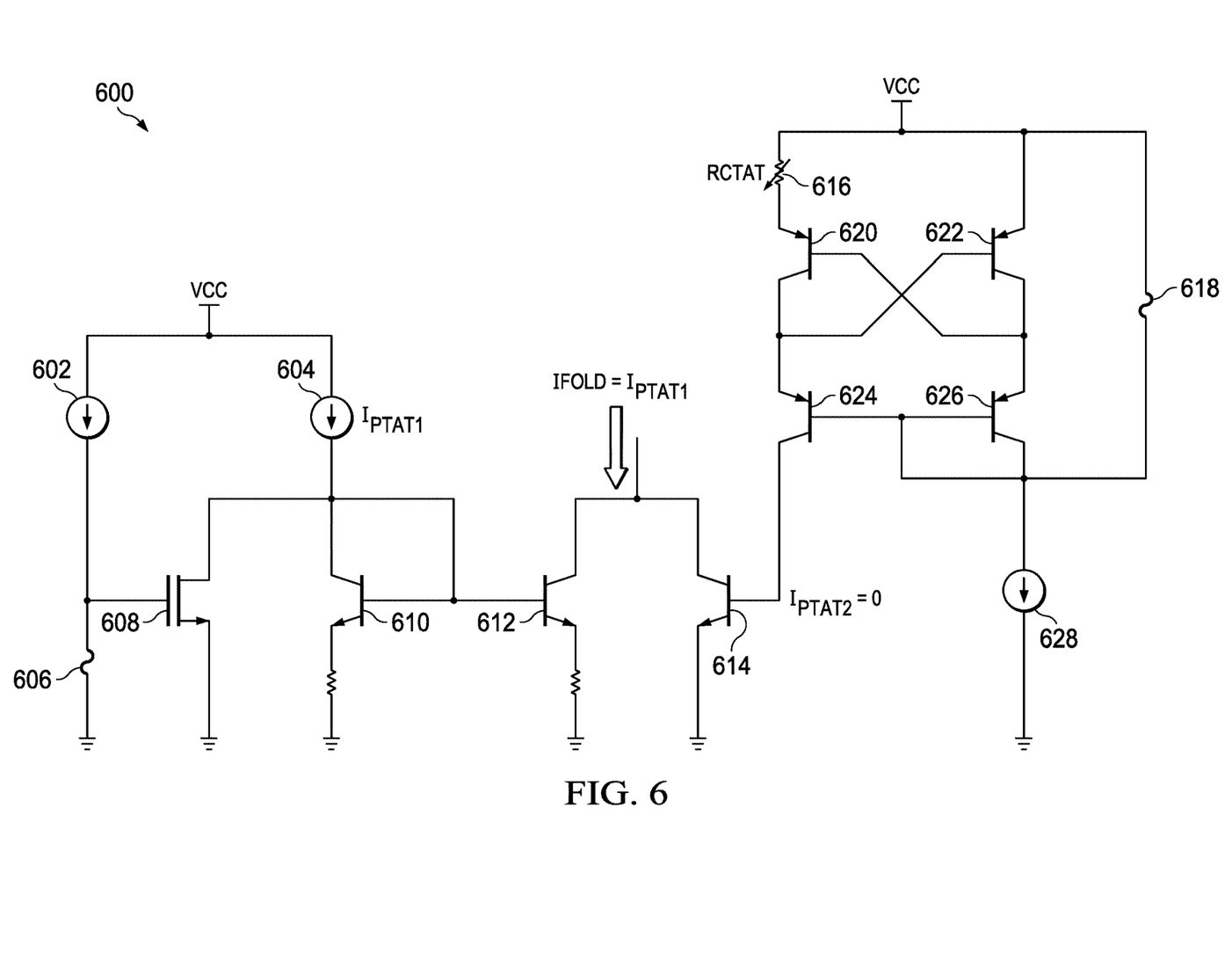
FIGS. 6 and 7 show schematic diagrams of circuitry used to trim an amplifier circuit in accordance with the present disclosure.
Figure 7:
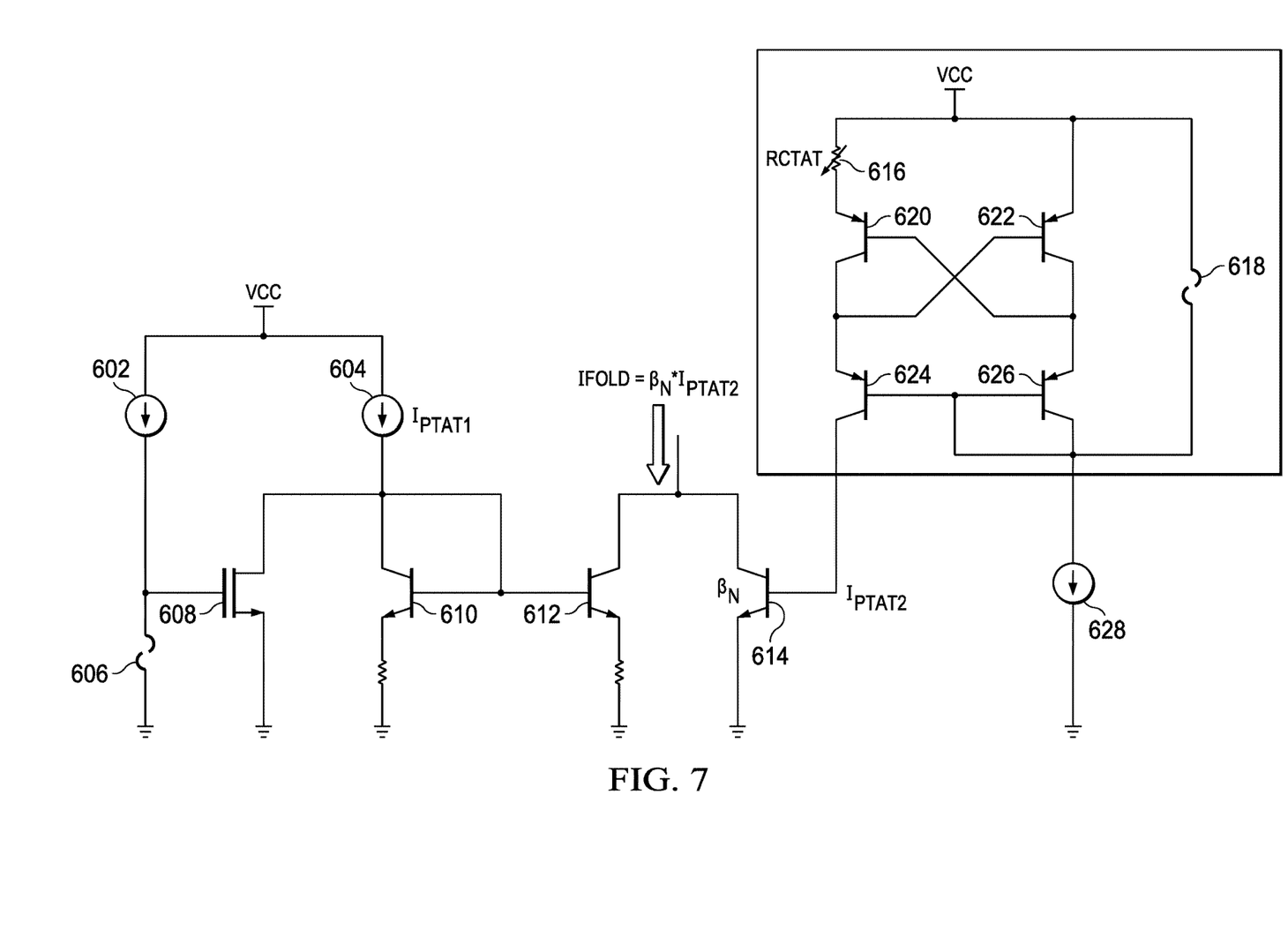

FIG. 5 shows a flow diagram for a method 500 for trimming an amplifier circuit in accordance with the present disclosure. Though depicted sequentially as a matter of convenience, at least some of the actions shown can be performed in a different order and/or performed in parallel. Additionally, some implementations may perform only some of the actions shown. FIGS. 6 and 7 show schematic diagrams of circuitry used to trim the amplifier circuit in the method 500. The circuitry of FIGS. 6 and 7 is included in some implementations of the amplifier input stage 200 or the amplifier input stage 300.

In block 502, a PTAT bias current is provided to the cascode transistors. Referring to FIG. 6, the fuse 606 is intact and conducting. As a result, the transistor 608 is off (the current source 602 is grounded) causing the current IPTAT1, provided by the current source 604, to flow in the transistor 610 and the transistor 612. The current IPTAT1 is proportional to absolute temperature. The transistor 612 is an implementation of a cascode transistor 210, 212, 310, or 312. Similarly, the fuse 618 is intact and conducting, which turns off the transistors 624 and 626 making the current IPTAT2 zero.

In block 504, while the current IPTAT1 is flowing in the transistor 612, the power supply current flowing in the amplifier circuit, of which the circuit 600 is part, is measured and trimmed to a predetermined value. This trimming compensates for process variation that affects the AC and DC parameters of the amplifier circuit. The trimming includes changing a value of resistance in a current generation circuit of the amplifier in some implementations.

In block 506, the current IPTAT1 is disabled by opening the fuse 606. Opening the fuse 606 turns on the transistor 608 and connects the current source 604 to ground.

In block 508, CTAT current is provided to the transistor 612 by opening the fuse 618. Referring to FIG. 7, when the fuse 618 is opened, the current IPTAT2 flows in the transistors 620, 622, 624, and 626 to the transistor 614. In turn, a CTAT current flows in the transistor 614 and the transistor 612.

In block 510, the resistor 616 is trimmed to produce a desired value of current IPTAT2, which produces a desired CTAT current and power supply current in the amplifier circuit.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An amplifier, comprising:
    an input transistor coupled to an input terminal;
    a first current source coupled to the input transistor, the first current source configured to provide a bias current to the input transistor that is proportional to absolute temperature;
    a cascode transistor coupled to the input transistor; and
    a second current source coupled to the cascode transistor, the second current source configured to provide a bias current to the cascode transistor that is complementary to absolute temperature;
    further comprising a diode connected transistor coupled to the cascode transistor and the second current source.

2. An amplifier, comprising:
    an input transistor coupled to an input terminal;
    a first current source coupled to the input transistor, the first current source configured to provide a bias current to the input transistor that is proportional to absolute temperature;
    a cascode transistor coupled to the input transistor; and
    a second current source coupled to the cascode transistor, the second current source configured to provide a bias current to the cascode transistor that is complementary to absolute temperature;
    wherein:
        the input transistor is a first input transistor;
        the input terminal is a first input terminal; and
        the amplifier further comprises a second input transistor coupled to a second input terminal and the first current source;
    wherein:
        the cascode transistor is a first cascode transistor; and
        the amplifier further comprises a second cascode transistor coupled to the second input transistor.

3. The amplifier of claim 2, further comprising a third current source coupled to the second cascode transistor, the third current source configured to provide a bias current to the second cascode transistor that is complementary to absolute temperature.

4. The amplifier of claim 3, further comprising a diode connected transistor coupled to the second cascode transistor and the third current source.

5. The amplifier of claim 2, further comprising a current mirror circuit coupled to the first cascode transistor and the second cascode transistor.

6. The amplifier of claim 2 further comprising a diode connected transistor coupled to the second current source, the first cascode transistor, and the second cascode transistor.

7. An amplifier, comprising:
an input transistor coupled to an input terminal;
a first current source coupled to the input transistor, the first current source configured to provide a bias current to the input transistor that is proportional to absolute temperature;
a cascode transistor coupled to the input transistor; and
a second current source coupled to the cascode transistor, the second current source configured to provide a bias current to the cascode transistor that is complementary to absolute temperature;
wherein the second current source comprises:
a third current source configured to generate a current that is proportional to absolute temperature;
a bipolar transistor coupled to the third current source.

8. An amplifier, comprising:
a first input terminal;
a second input terminal;
a first input transistor comprising a first terminal coupled to the first input terminal;
a second input transistor comprising:
a first terminal coupled to the second input terminal; and
a second terminal coupled to a second terminal of the first input transistor;
a first current source coupled to the second terminal of the second input transistor, and configured to provide a bias current to the first input transistor and the second input transistor that is proportional to absolute temperature;
a first cascode transistor comprising a first terminal coupled to a third terminal of the first input transistor;
a second cascode transistor comprising a first terminal coupled to a third terminal of the second input transistor; and
a second current source coupled to the second cascode transistor, and configured to provide a bias current to the second cascode transistor that is complementary to absolute temperature;
further comprising:
a diode connected transistor comprising:
a first terminal coupled to the second current source; and
a second terminal coupled to the second current source, a second terminal of the first cascode transistor, and a second terminal of the second cascode transistor.

9. An amplifier, comprising:
a first input terminal;
a second input terminal;
a first input transistor comprising a first terminal coupled to the first input terminal;
a second input transistor comprising:
a first terminal coupled to the second input terminal; and
a second terminal coupled to a second terminal of the first input transistor;
a first current source coupled to the second terminal of the second input transistor, and configured to provide a bias current to the first input transistor and the second input transistor that is proportional to absolute temperature;
a first cascode transistor comprising a first terminal coupled to a third terminal of the first input transistor;
a second cascode transistor comprising a first terminal coupled to a third terminal of the second input transistor; and
a second current source coupled to the second cascode transistor, and configured to provide a bias current to the second cascode transistor that is complementary to absolute temperature;
further comprising:
a current mirror circuit comprising:
a first transistor connected as a diode, and comprising a first terminal coupled to a second terminal of the first cascode transistor and a second terminal of the first transistor of the current mirror circuit;
a second transistor comprising:
a first terminal coupled to a second terminal of the second cascode transistor; and
a second terminal coupled to the second terminal of the first transistor of the current mirror circuit.

10. An amplifier, comprising:
a first input terminal;
a second input terminal;
a first input transistor comprising a first terminal coupled to the first input terminal;
a second input transistor comprising:
a first terminal coupled to the second input terminal; and
a second terminal coupled to a second terminal of the first input transistor;
a first current source coupled to the second terminal of the second input transistor, and configured to provide a bias current to the first input transistor and the second input transistor that is proportional to absolute temperature;
a first cascode transistor comprising a first terminal coupled to a third terminal of the first input transistor;
a second cascode transistor comprising a first terminal coupled to a third terminal of the second input transistor; and
a second current source coupled to the second cascode transistor, and configured to provide a bias current to the second cascode transistor that is complementary to absolute temperature;
further comprising a diode connected transistor comprising:
a first terminal coupled to the second current source; and
a second terminal coupled to a second terminal of the second cascode transistor and the second current source.

11. An amplifier, comprising:
a first input terminal;
a second input terminal;
a first input transistor comprising a first terminal coupled to the first input terminal;
a second input transistor comprising:
a first terminal coupled to the second input terminal; and
a second terminal coupled to a second terminal of the first input transistor;
a first current source coupled to the second terminal of the second input transistor, and configured to provide a bias current to the first input transistor and the second input transistor that is proportional to absolute temperature;
a first cascode transistor comprising a first terminal coupled to a third terminal of the first input transistor;
a second cascode transistor comprising a first terminal coupled to a third terminal of the second input transistor; and
a second current source coupled to the second cascode transistor, and configured to provide a bias current to the second cascode transistor that is complementary to absolute temperature;

further comprising:
a third current source coupled to the first cascode transistor, and configured to provide a bias current to the first cascode transistor that is complementary to absolute temperature; and
a diode connected transistor comprising:
a first terminal coupled to the third current source; and
a second terminal coupled to a second terminal of the first cascode transistor and the second current source.

12. An amplifier input stage, comprising:
a first input transistor and a second input transistor connected as a differential pair;
a proportional to absolute temperature (PTAT) current source coupled to the first input transistor and the second input transistor, and configured to provide a bias current to the first input transistor and the second input transistor that is proportional to absolute temperature;
a first cascode transistor coupled to the first input transistor;
a second cascode transistor coupled to the second input transistor; and
one or more complementary to absolute temperature (CTAT) current sources coupled to the first cascode transistor and the second cascode transistor, and configured to provide bias currents to the first cascode transistor and the second cascode transistor that are complementary to absolute temperature;
further comprising:
a diode connected transistor coupled to the first cascode transistor;
wherein the one or more CTAT current sources comprises a first CTAT current source coupled to the diode connected transistor, and configured to provide a bias current to the first cascode transistor that is complementary to absolute temperature.

13. The amplifier input stage of claim 12, wherein:
the diode connected transistor is coupled to the second cascode transistor; and
the first CTAT current source is configured to provide a bias current to the second cascode transistor that is complementary to absolute temperature.

14. The amplifier input stage of claim 12, wherein:
the diode connected transistor is a first diode connected transistor;
the amplifier input stage comprises a second diode connected transistor coupled to the second cascode transistor; and
the one or more CTAT current sources comprises a second CTAT current source coupled to the second diode connected transistor, and configured to provide a bias current to the second cascode transistor that is complementary to absolute temperature.

15. An amplifier input stage, comprising:
a first input transistor and a second input transistor connected as a differential pair;
a proportional to absolute temperature (PTAT) current source coupled to the first input transistor and the second input transistor, and configured to provide a bias current to the first input transistor and the second input transistor that is proportional to absolute temperature;
a first cascode transistor coupled to the first input transistor;
a second cascode transistor coupled to the second input transistor; and
one or more complementary to absolute temperature (CTAT) current sources coupled to the first cascode transistor and the second cascode transistor, and configured to provide bias currents to the first cascode transistor and the second cascode transistor that are complementary to absolute temperature;
wherein:
the PTAT current source is a first PTAT current source; and
the one or more CTAT current sources comprise:
a bipolar transistor; and
a second PTAT current source coupled to the bipolar transistor, and configured to provide a bias current to the bipolar transistor that is proportional to absolute temperature.

16. A method, comprising:
supplying a first bias current that is proportional to absolute temperature to a cascode transistor of an input stage of an amplifier;
trimming a power supply current of the amplifier while the supplying the first bias current; and
disabling the first bias current and supplying a second bias current that is complementary to absolute temperature to the cascode transistor;
wherein disabling the first bias current comprises opening a first fuse and supplying the second bias current comprises opening a second fuse.

* * * * *